United States Patent [19]
Hebda

[11] 3,931,580
[45] Jan. 6, 1976

[54] DIGITAL LINE RECEIVER CIRCUIT

[75] Inventor: Edward F. Hebda, Lomita, Calif.

[73] Assignee: Xerox Corporation, Stamford, Conn.

[22] Filed: June 10, 1974

[21] Appl. No.: 477,885

[52] U.S. Cl............ 328/164; 179/15 AD; 307/268
[51] Int. Cl.² ........................................... H04B 3/36
[58] Field of Search................... 328/164, 163, 162; 179/15 AD; 307/234, 268

[56] References Cited
UNITED STATES PATENTS

| | | |
|---|---|---|
| 3,584,310 | 6/1971 | Hochfelder .......................... 328/164 |
| 3,790,894 | 2/1974 | Iizuka et al. ........................ 328/164 |

*Primary Examiner*—John Kominski
*Attorney, Agent, or Firm*—James J. Ralabate; Franklyn C. Weiss; Anthony J. Sarli, Jr.

[57] ABSTRACT

A digital line receiver circuit which incorporates a slope detector in the form of a differential voltage comparator. The two inputs to the comparator receive a composite digital video signal but the signal on the second input is modified by a delay and biasing arrangement such that the output gives a representation of the time positions of polarity changes of the digital input.

5 Claims, 9 Drawing Figures

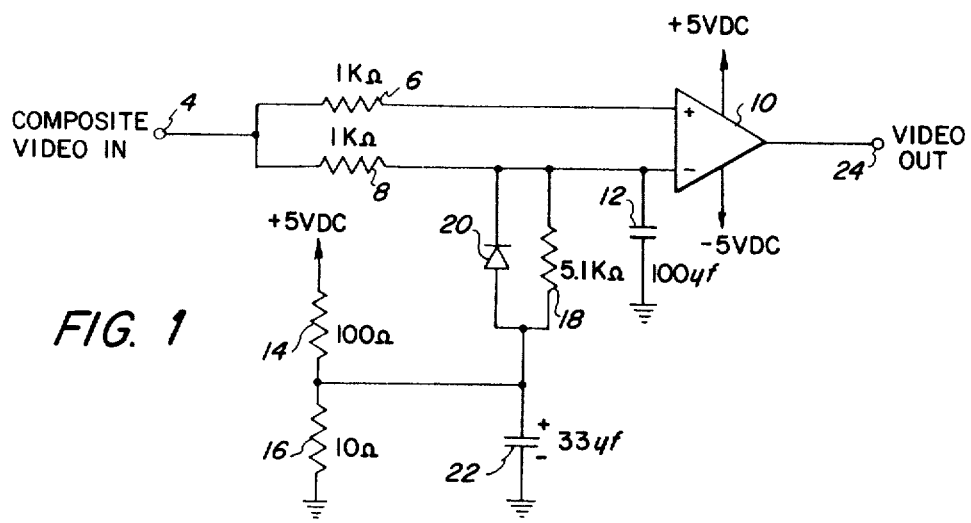
*FIG. 1*
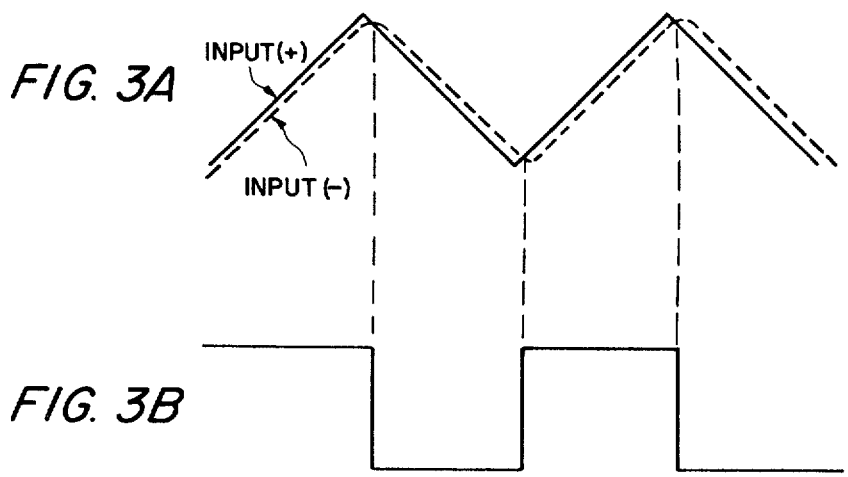
*FIG. 3A*
*FIG. 3B*

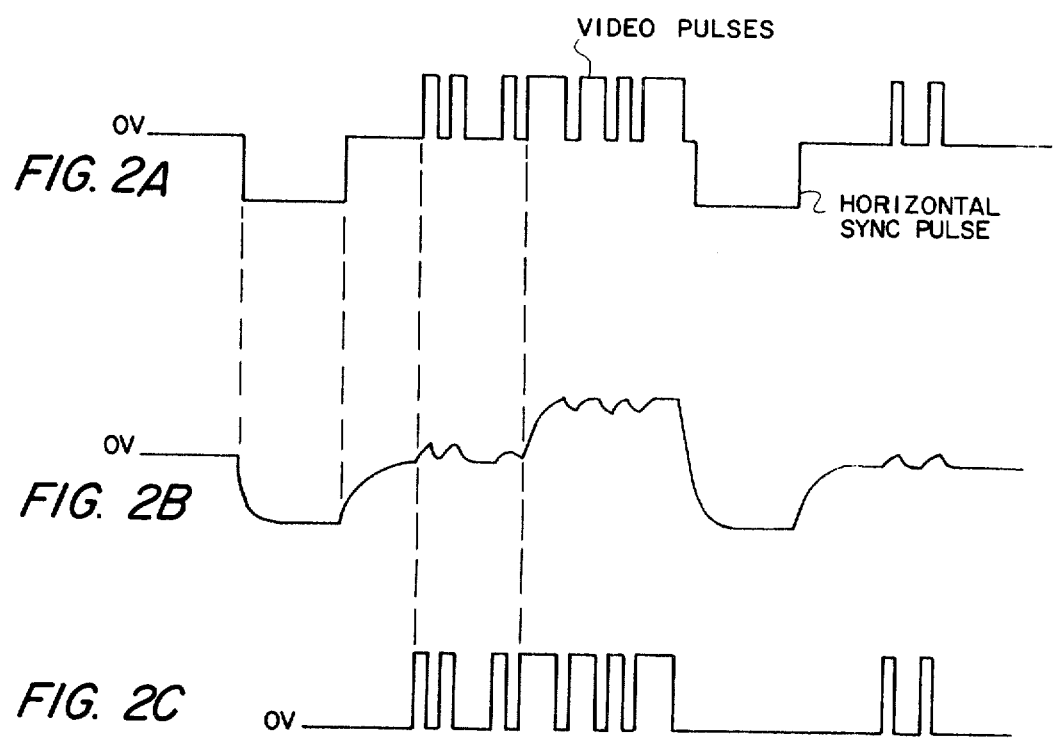

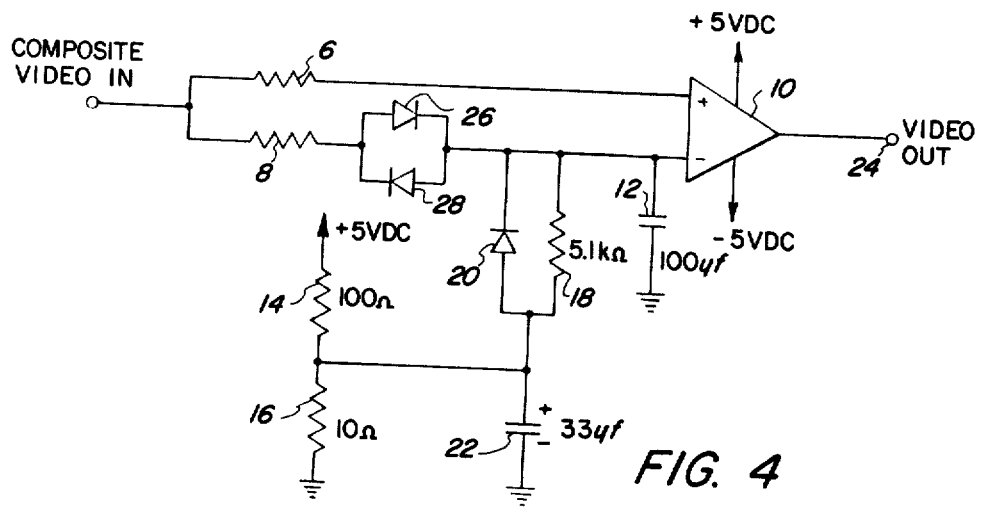
FIG. 4
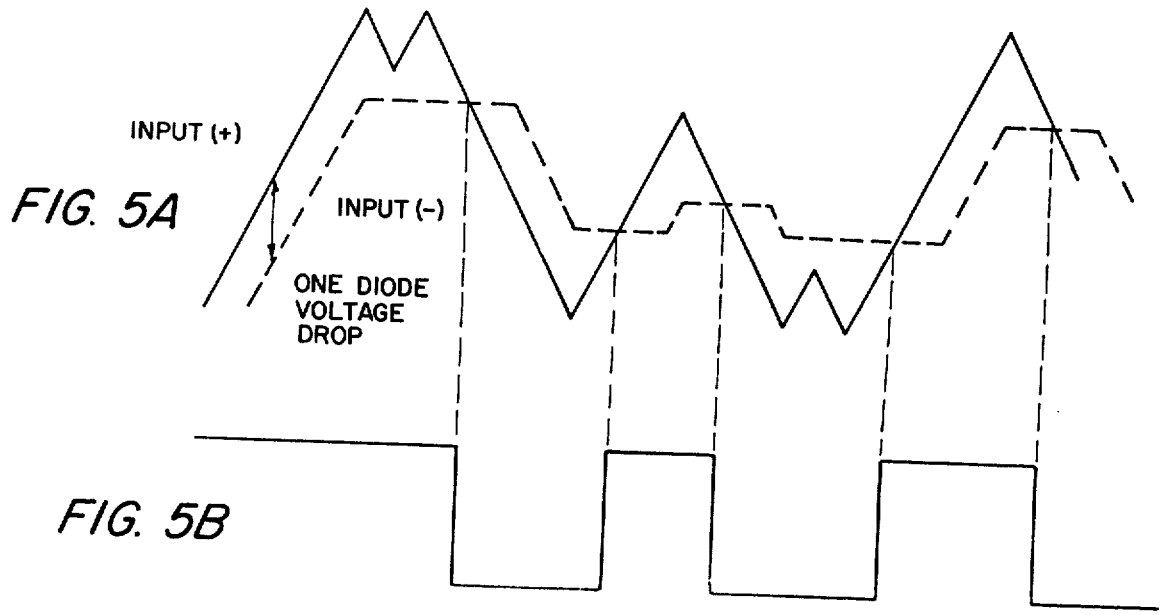
FIG. 5A
FIG. 5B 3,931,580

DIGITAL LINE RECEIVER CIRCUIT

BACKGROUND OF THE INVENTION

Field of the Invention

The instant invention relates to digital line receiver circuits and more particularly circuits capable of representing polarity changes of a digital signal which has been transmitted over a long cable and is thereby substantially distorted by the attenuation of the high frequency components of the pulses by the skin effect phenomenon in the center conductor of the transmitting cable. The invention is particularly useful for the reception of composite digital video signals since such signals have a wide range of pulse width. The varying pulse width prevents the use of a single threshold level which can allow detection of the short as well as the long pulses. Even is such detection were feasible, it would cause severe distortion of the time duration of the detected pulses. Such time duration distortion would be very noticeable on a television screen.

It has been found that, although there is severe amplitude attenuation of the short pulses by the transmitting cable, one property of the pulses is faithfully transmitted by the cable. This property is the relative time at which the input signal to the cable changed state (i.e., from a logical one to a logical zero or vice versa). At the output end of the cable, a change of state of the input signal produces a change in the sign of the slope of the output signal (i.e., the slope changes from a positive value to a slope with a negative value or vice versa).

SUMMARY OF THE INVENTION

In order to allow detection of the property of the relative time at which time the input signal to the cable changes state the instant invention provides a differential amplifier arrangement with a time delay mechanism on one of the two inputs to the differential amplifier. The differential amplifier, so arranged, detects a change in the slope of a signal. It has been found that, for a steady state signal at the two inputs of the differential amplifier, an indeterminate output might result. To prevent such a condition a biasing arrangement is provided such that one of the inputs can never attain the maximum voltage of the other input in a steady state condition. Further, since the instant invention was primarily directed to the reception of composite video signals, it was considered desirable to remove the effect of the negative sync pulses from the signal.

BRIEF DESCRIPTION OF THE DRAWINGS

These and other features of the instant invention may be better understood by referring to the following specification including the drawings in which:

FIG. 1 is a schematic diagram of a preferred embodiment of the instant invention.

FIG. 2 is a waveform diagram showing voltage relationships between a transmitted composite digital video signal and signals as received and modified by the circuit of FIG. 1.

FIG. 3 is a waveform diagram showing voltage relationships between signals at the input and output of the circuit of the invention.

FIG. 4 is a schematic diagram of an alternate embodiment of the invention.

FIG. 5 is a waveform diagram showing voltage relationships between signals at the input and output of the circuit of the alternate embodiment.

DESCRIPTION OF THE PREFERRED EMBODIMENT

FIG. 1 of the drawings discloses a circuit according to the instant invention. A composite video signal is applied at the input terminal of the circuit, 4. The signal is divided and carried on two separate lines through balancing resistors to the positive and negative inputs of a differential voltage amplifier 10. A suitable amplifier device is manufactured by Texas Instruments and is designated SN75107A. Appropriate voltages are applied to the amplifier device as shown by the plus 5 and minus 5 volts DC notations. The video signal appearing at the positive input to the differential amplifier 10 is substantially the same as that received at the receiving end of the cable. The signal received at the negative terminal of the differential amplifier, however, is modified through the use of a capacitor 12 which provides a time delay in the signal when a change in polarity of the signal is detected.

The negative input to the amplifier is further biased by a biasing circuit which includes a five volt DC positive voltage source and a voltage divider consisting of a 100 ohm resistor 14 and a 10 ohm resistor 16. Connected between the biasing circuit and the negative amplifier input is a resistor 18 in parallel with a diode 20, the function of which will be discussed later. Also associated with a common connection of the diode 20 and resistor 18 is an electrolytic capacitor 22 which functions merely as a filtering capacitor to remove power supply transients from the biasing circuit.

Waveform A in FIG. 2 is representative of a typical composite video digital signal appearing at the input end of a cable. Shown in that waveform are the video pulses which are of varying width and a negative horizontal synchronization pulse which is associated with video signals. In a preferred embodiment, as envisioned by the instant disclosure, the shortest pulse transmitted may be on the order of 90 nanoseconds. The longest pulse, on the other hand, may be as long as one fourth millisecond in duration. It should be noted that these figures are only approximate and are not necessarily limiting. They merely are presented here to provide an illustration of the substantial range of pulse widths which may be encountered in signals for which this circuit is useful.

The waveform shown at FIG. 2B is a representation of the waveform of FIG. 2A after having been transmitted through a length of coaxial cable (for example, 1000 feet). In order to detect the positions of the changes of state of the video pulses in such a signal, it is obvious that it is not possible to merely establish a single threshold level which would allow detection of the shorter pulses, particularly since the presence of a relatively wide pulse tends to raise the mean level of the subsequent pulses in the pulse chain. Even if such detection were feasible, it would cause severe distortion of the time duration of the detected pulses which would be quite noticeable on a television screen. The distortion of the pulses shown in FIG. 2B is primarily due to the attenuation of the high frequency components of the pulse by skin effect phenomenon in the center conductor of the coaxial cable.

As previously noted, although severe amplitude attenuation of the short pulses exists, one property of the pulses is faithfully transmitted by the cable. This property is the relative time at which the input signal to the cable changed state (i.e., from a logical one to a logical zero or vice versa).

In order to detect the change in slope of the signal, a time-delay capacitor is necessary on one of the two inputs to the differential amplifier 10. Both inputs of the amplifier 10 would tend to follow the input but the negative input tends to lag the positive input because of the capacitor 12. If the input voltage has a positive rate of change, then the positive input exceeds the negative input and the output of the amplifier 10 is positive. However, if the rate of change of the input voltage becomes negative, then the positive input will be less positive then the negative input and the output of the amplifier 10 will be negative. FIG. 3 shows representative waveforms which would be produced merely by using the capacitor 12 as set forth above. FIG. 3A shows the inputs to the positive and negative input connections of the amplifier 10. The waveform of FIG. 3B shows the resultant output waveform of the amplifier 10 which would appear at terminal 24 (the waveforms as shown in FIGS. 3A and 3B are, again, merely representative and do not depict precisely the waveform of a signal to be detected by the device of the instant invention).

It is possible that, for a steady state signal at the input of the circuits having only a capacitor 12 on the negative input to the amplifier 10 an indeterminate output might result. To prevent such a condition, a resistor 18 is added which, in the most basic case, could merely be terminated by a reference voltage, for example, plus 0.5 volt DC. Resistor 18 forms a voltage divider with the 1K resistor on the negative lead of the amplifier and applies the bias input to the negative input terminal of the amplifier 10. With such an arrangement, if the input takes on a steady state value greater than the reference level (in this case greater than ½ volt) the output of the amplifier 10 is positive. If the input voltage is less than the reference voltage, then the output is negative. However, for a non-steady state condition, resistor 18 does not significantly change the operation of the circuit from that shown by the waveforms of FIG. 3. In the preferred embodiment, however, the 100 ohm and 10 ohm resistor voltage divider is used to provide biasing. This voltage divider is of sufficiently low impedance to be considered a pure voltage source.

Additionally, it is desirable to strip the signal of FIG. 2B of the negative synchronization pulses. To this end, a diode 20 is provided in parallel with the resistor 18. The resulting output signal to the amplifier 10 is shown in FIG. 2 and is represented as the waveform 2C.

When receiving signals over a cable of substantial length, noise can present a problem. It is therefore desirable to have a threshold on the detector such as that shown in FIG. 4 which is an alternate embodiment of FIG. 1 further including a pair of parallel opposed diodes, 26 and 28. The circuit as shown in FIG. 4 allows the input to change approximately one diode voltage drop before the output voltage of the amplifier can change. The action of the threshold detector is shown in FIG. 5 in the waveform of FIG. 5A. FIG. 5A shows an input signal on the positive side of the differential amplifier and the modified input signal which is presented to the negative input of the operational amplifier. The waveform of FIG. 5B shows the output of the amplifier 10. It should be noted that the addition of the noise threshold circuit does provide some distortion of pulse time duration, but so long as the threshold level is held reasonably close to the input voltage level, the distortion will have a negligible effect on the television screen display.

Obviously, many modifications of the present invention are possible in light of the above teaching. It is therefore to be understood that, in the scope of the appended claims, the invention may be practiced other than as specifically described.

What is claimed is:
1. A circuit for detecting the state changes of a digital video waveform comprising:
   a. a differential amplifier having a first and second input and an output,
   b. means for applying a digital signal to said first and second inputs, and
   c. said second input having connected thereto
      1. time delay means to delay the application of said waveform to said second input,
      2. biasing means to prevent the voltage at said second input to reach the voltage at said first input during steady state operation, and
      3. means for preventing negative voltages from appearing at said second input.

2. A circuit as set forth in claim 1 further comprising threshold means connected to said second input to reduce noise effects associated with said digital waveform.

3. A circuit as set fourth in claim 1 wherein said biasing means is a voltage divider.

4. A circuit as set forth in claim 1 wherein said means for preventing negative voltages is a diode.

5. A circuit as set forth in claim 2 wherein said threshold is a pair of parallel opposed diodes.

* * * * *